United States Patent
Cai et al.

(10) Patent No.: US 9,741,745 B2
(45) Date of Patent: Aug. 22, 2017

(54) ARRAY SUBSTRATE, METHOD FOR MANUFACTURING THE SAME AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui Province (CN)

(72) Inventors: Zhenfei Cai, Beijing (CN); Zhengwei Chen, Beijing (CN)

(73) Assignees: BOE TECHNOLOGY GROUP CO., LTD. (CN); HEFEI XINSHENG OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 14/386,404

(22) PCT Filed: Nov. 21, 2013

(86) PCT No.: PCT/CN2013/087564
§ 371 (c)(1),
(2) Date: Sep. 19, 2014

(87) PCT Pub. No.: WO2015/027585
PCT Pub. Date: Mar. 5, 2015

(65) Prior Publication Data
US 2015/0060868 A1    Mar. 5, 2015

(30) Foreign Application Priority Data
Aug. 30, 2013 (CN) .......................... 2013 1 0388557

(51) Int. Cl.
*H01L 27/12* (2006.01)
*G02F 1/1345* (2006.01)
(Continued)

(52) U.S. Cl.
CPC ........ *H01L 27/124* (2013.01); *G02F 1/13452* (2013.01); *G02F 1/136286* (2013.01); *G02F 2001/133388* (2013.01)

(58) Field of Classification Search
CPC .... H01L 27/124; H01L 27/127; H01L 23/585
(Continued)

(56) References Cited

U.S. PATENT DOCUMENTS 5,841,490 A * 11/1998 Matsuo ........................... 349/40
2003/0117536 A1* 6/2003 Jeon .................. G02F 1/136286
349/40
(Continued)

FOREIGN PATENT DOCUMENTS

CN           1832184        9/2006
CN        101221959 A       7/2008
(Continued)

OTHER PUBLICATIONS

First Office Action issued in corresponding Chinese Application No. 2013103885572 dated May 28, 2015.
(Continued)

*Primary Examiner* — Marc Armand
*Assistant Examiner* — Sue Tang
(74) *Attorney, Agent, or Firm* — Brooks Kushman P.C.

(57) ABSTRACT

The present disclosure discloses an array substrate including a display area and a data lead area. The display area includes data signal lines and gate lines. The data lead area includes peripheral wirings connecting the data signal lines and wiring terminals. The peripheral wirings include a plurality of metal traces which are corresponding to the data signal lines in a one-to-one manner and manufactured from a same layer as the gate lines. Each of the metal traces is connected to one of the data signal lines which is corresponding to the each of the metal trace.

7 Claims, 3 Drawing Sheets

(51) Int. Cl.
*G02F 1/1362* (2006.01)
*G02F 1/1333* (2006.01)

(58) Field of Classification Search
USPC .............................................. 257/72; 438/158
See application file for complete search history.

(56) References Cited

U.S. PATENT DOCUMENTS

| | | | |
|---|---|---|---|
| 2005/0087742 A1* | 4/2005 | Chang et al. .................... | 257/72 |
| 2008/0128699 A1* | 6/2008 | Seong et al. .................... | 257/59 |
| 2012/0112199 A1* | 5/2012 | Son ....................... | H01L 27/124 |
| | | | 257/72 |
| 2012/0306350 A1* | 12/2012 | Zeng et al. ................... | 313/495 |

FOREIGN PATENT DOCUMENTS

| | | |
|---|---|---|
| CN | 103208491 | 7/2013 |
| CN | 103219319 | 7/2013 |

OTHER PUBLICATIONS

International Search Report and Written Opinion issued in corresponding International Application No. PCT/CN2013/087564 dated May 28, 2014.
Office Action in Chinese Patent Application No. 201310388557.2, dated Dec. 14, 2015.
Office Action in Chinese Patent Application No. 201310388557.2, dated May 11, 2016.

\* cited by examiner

-PRIOR ART-

ARRAY SUBSTRATE, METHOD FOR MANUFACTURING THE SAME AND DISPLAY DEVICE

CROSS-REFERENCE TO RELATED APPLICATION

This application is the U.S. national phase of PCT Application No. PCT/CN2013/087564 filed on Nov. 21, 2013, which claims priority to Chinese Patent Application No. 201310388557.2 filed on Aug. 30, 2013, the disclosures of which are incorporated in their entirety by reference herein.

TECHNICAL FIELD

The present disclosure relates to the field of display technology, and in particularly to an array substrate, a method for manufacturing the same and a display device.

BACKGROUND

As shown in FIG. 1, presently, an array substrate with a normal bezel adopts a wiring manner shown in FIG. 1. The array substrate includes data signal lines 01 within a display area A, metal traces 2 within a dashed box B, a short-circuiting ring 04 having an initial end manufactured by using metal of a data metal layer, and a short-circuiting ring 03 having an initial end manufactured from a gate metal layer.

In the field of display technology, in order to simplify the process of manufacturing array substrates and reduce manufacturing cost of the array substrates, a current process of manufacturing array substrates of display devices in an ADS mode includes: ①̂ manufacturing common electrodes, ②̂ forming gate signal lines, ③̂ forming a first insulating layer, a semi-conductor layer and a data metal layer on the gate signal lines, and then forming data signal lines and metal traces connected to sides of data electrodes through a patterning process, ④̂ manufacturing a second insulating layer on the data signal lines and the metal traces, and ⑤̂ forming pixel electrodes on the second insulating layer.

In the above process, in order to reduce complexity of the process, the data signal lines and an active layer in the display area as well as peripheral wirings in a data lead area are formed from the semi-conductor layer and the data metal layer through one-time patterning process. However, in a photo-etching process for manufacturing the first insulating layer, the semi-conductor layer and the data metal layer, dry etching is adopted for etching. Since the dry etching process has the problem of etching direction, some of the semi-conductor layer under the data metal layer is remained after the dry etching, the resulting metal races 02 have a larger width, and this results in that the traces in the data lead area occupy a larger space when wiring, which is not conductive to realize a narrow bezel design of the display device.

SUMMARY

The present disclosure provides an array substrate, a method for manufacturing the same and a display device. In the array substrate, a width of each metal trace of peripheral wirings on one side of data electrodes and an interval between two adjacent metal traces are relatively small, and thus space occupied by the above peripheral wirings when wiring is reduced, and this facilitates a narrow bezel design of the display device.

To achieve the above objects, the following technical solutions are provided in the present disclosure.

An array substrate includes a display area and a data lead area, the display area including data signal lines and gate lines, and the data lead area including peripheral wirings connecting the data signal lines to wiring terminals, wherein the peripheral wirings include a plurality of metal traces which are corresponding to the data signal lines in a one-to-one manner and manufactured from a same layer as the gate lines; each of the metal traces is connected to one of the data signal lines which is corresponding to the each of the metal traces.

In the above array substrate, the metal traces of the peripheral wirings in the data lead area and the gate lines are manufactured from the same layer, and the corresponding gate lines and the above metal traces are manufactured from the gate metal layer though one-time patterning process separately, thus, a width of each resulting metal trace and an interval between metal traces can be relatively small.

Thus, in the above array substrate, the width of teach metal trace in the data lead area and the interval between two adjacent metal traces can be relatively small, and then the space occupied by the above peripheral wirings when wiring can be reduced, and this facilitates the narrow bezel design of the display device.

Optionally, each of the metal traces may be electrically connected to the corresponding data signal line via a connection line, and wherein a first insulating layer is provided between the metal traces and the data signal lines; a second insulating layer is provided between the data signal lines and the connection lines; the first insulating layer and the second insulating layer have first via holes which are corresponding to the metal traces in a one-to-one manner; the second insulating layer has second via holes which are corresponding to the data signal lines in a one-to-one manner; each connection line is electrically connected to the corresponding metal trace via one of the first via holes, and is electrically connected to the corresponding data signal line via one of the second via holes.

In order to facilitate detecting the data signal lines in the display area, optionally, the array substrate further includes a first short-circuiting ring manufactured from a same layer as the data signal lines, and a second short-circuiting ring manufactured from the same layer as the gate lines; wherein the first short-circuiting ring and the second short-circuiting ring are connected to the wiring terminals; among the plurality of metal traces, metal traces connected to the first short-circuiting ring and metal traces connected to the second short-circuiting ring are alternately arranged.

Optionally, each of the metal traces connected to the first short-circuiting ring is electrically connected to the first short-circuiting ring via a connection line, and wherein a first insulating layer is provided between the metal traces and the first short-circuiting ring; a second insulating layer is provided between the first short-circuiting ring and the connection line; the first insulating layer and the second insulating layer have first via holes which are corresponding to the metal traces in a one-to-one manner, the second insulating layer has a second via hole which is corresponding to the first short-circuiting ring; each connection line is electrically connected to the corresponding metal trace via one of the first via holes, and is electrically connected to the first short-circuiting ring via the second via hole.

Optionally, the array substrate further includes pixel electrodes formed on the second insulating layer. In order to reduce thickness of the array substrate, the connection line between the above data signal line and the corresponding metal trace, and the connection line between the first short-circuiting ring and the corresponding metal trace may be manufactured from a same layer with the pixel electrode.

Optionally, the connection lines may be connection lines made of ITO material.

A display device is further provided in the present disclosure, which includes any one of the array substrates provided in the above technical solutions.

A method for manufacturing the above array substrate is further provided in the present disclosure, which includes:

forming a gate metal layer on a base substrate, and forming a pattern of gate lines and metal traces of peripheral wirings through one-time patterning process;

forming a first insulating layer, a semi-conductor layer and a data metal layer on the gate metal layer, and forming a pattern of an active layer and a pattern of data signal lines through one-time patterning process;

forming a second insulating layer on the data metal layer; and forming a transparent conductive layer on the second insulating layer, and forming a pattern of pixel electrodes through a patterning process.

In the array substrate manufactured through the above method, the metal traces and the gate lines are manufactured from the same layer, a width of each metal trace and an interval between two adjacent metal traces can be relatively small; this may reduce space occupied by the above peripheral wirings when wiring, and facilitate the narrow bezel design of the display device.

Optionally, the method further includes: forming a pattern of a second short-circuiting ring of the peripheral wirings at the time of forming a pattern of gate lines and metal traces of peripheral wirings through one-time patterning process; forming a pattern of a first short-circuiting ring of the peripheral wirings at the time of forming a pattern of an active layer and a pattern of data signal lines through one-time patterning process; wherein among the metal traces, metal traces connected to the first short-circuiting ring and metal traces connected to the second short-circuiting ring are alternately arranged; and the first short-circuiting ring and the second short-circuiting ring are connected to wiring terminals, respectively.

Optionally, the forming a second insulating layer on the data metal layer includes:

forming a plurality of second via holes penetrating through the first insulating layer and forming a plurality of first via holes penetrating through the first insulating layer and the second insulating layer through a patterning process;

wherein forming a pattern of connection lines connecting the metal traces connected with the data signal lines to the data signal lines, and a pattern of connection lines connecting the metal traces connected with the first short-circuiting ring to the first short-circuiting ring at the time of forming a pattern of pixel electrodes through a patterning process;

wherein the connection lines connecting the metal traces connected with the data signal lines to the data signal lines are connected to the metal traces connected with the data signal lines via some of the first via holes, respectively, and are connected to the data signal lines via some of the second via holes, respectively; and the connection lines connecting the metal traces connected with the first short-circuiting ring to the first short-circuiting ring are connected to the metal traces connected with the first short-circuiting ring via the remaining part of the first via holes, and are connected to the first short-circuit ring via the remaining part of the second via holes.

DETAILED DESCRIPTION

Technical solutions in embodiments of the present disclosure will be described clearly and completely hereinafter in conjunction with the drawings in the embodiments of the present disclosure. Apparently, the described embodiments are only some but not all embodiments of the present disclosure. All the other embodiments obtained by those skilled in the art based on the embodiments of the present disclosure without creative labor will fall within the protection scope of the present disclosure.

Figure 1:
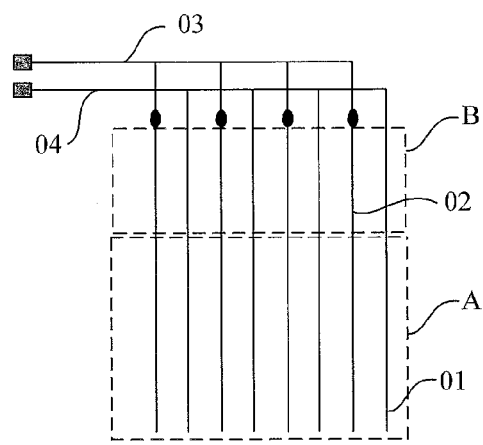
FIG. 1 is a schematic diagram showing a wiring principle of data signal lines and peripheral wirings in an array substrate in the prior art.
Figure 2:
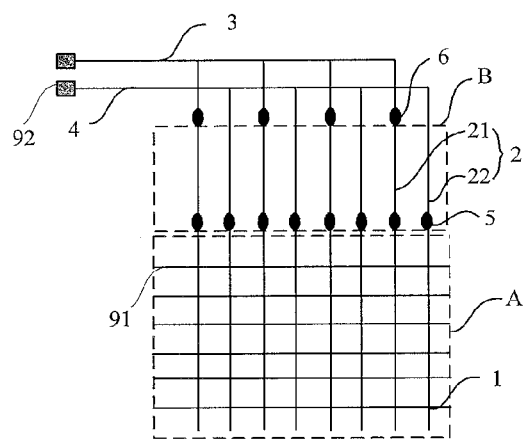
FIG. 2 is a schematic diagram showing a wiring principle of data signal lines and peripheral wirings in an array substrate according to one embodiment of the present disclosure.

Referring to FIG. 2, an array substrate of a display device according to one embodiment of the present disclosure includes data signal lines 1 and gate lines 91 located within a display area A, and peripheral wirings which are located within a non-display area and connect the data signal lines 1 to wiring terminal pads 92 in the non-display area. The peripheral wirings include a plurality of metal traces 2 which are corresponding to the data signal lines 1 in a one-to-one manner and manufactured from a same layer as the gate lines. As shown by a dashed box B in FIG. 2, each metal trace 2 is connected to a corresponding data signal line 1, and each metal trace 2 is a metal trace manufactured from a gate metal layer for manufacturing the gate lines.

In the above array substrate, the metal traces 2 of the peripheral wirings in the non-display area and the gate lines are manufactured from the same layer. Since the corresponding gate lines and the above metal traces are manufactured from the gate metal layer through one-time patterning process separately, and wet etching is adopted in the patterning process of the gate metal layer, thus, a width of each resulting metal trace 2 and an interval between two adjacent metal traces 2 may be relatively small.

Therefore, in the above array substrate, the width of each metal trace 2 in the data lead area and the interval between two adjacent metal traces 2 are relatively small, thereby reducing space occupied by the above metal traces, which is conductive to realize a narrow bezel design of the display device.

In the above embodiment, connection between a pair of the metal trace 2 and the corresponding data signal line 1 may be implemented in various ways. Since the data signal lines 1 and the metal traces 2 are provided in different layers, the metal trace 2 and the data signal line 1 may be connected directly through via holes.

Figure 3:
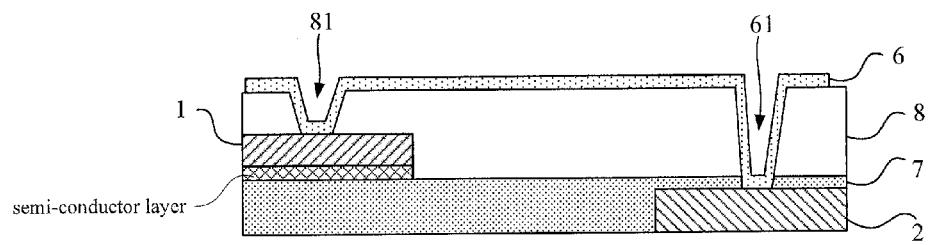
FIG. 3 is a schematic structural diagram showing electrical connection positions between one data signal line and one metal trace in the array substrate according to one embodiment of the present disclosure.

Practically, referring to FIG. 2 and FIG. 3, as shown in FIG. 2, each metal trace 2 and the corresponding data signal line 1 may be connected electrically via a connection line 6.

As shown in FIG. 3, a first insulating layer 7 is provided between the metal trace 2 and the data signal line 1; a second insulating layer 8 is provided between the data signal line 1 and the connection line 6. The first insulating layer 7 and the second insulating layer 8 have first via holes 61 which are corresponding to the metal traces 2 in a one-to-one manner. The second insulating layer 8 has second via holes 81 which are corresponding to the data signal lines 1 in a one-t-one manner. Each connection line 6 is electrically connected to the corresponding metal trace 2 via one first via hole 61, and is electrically connected to the corresponding data signal line 1 via one second via hole 81. Thereby, the connection between the metal trace 2 and the corresponding data signal line 1 is achieved.

Referring to FIG. 2, based on the above embodiment, in order to facilitate detecting the data signal lines 1 in the display area, the above array substrate optionally further includes a first short-circuiting ring 3 manufactured from a same layer as the data signal lines 1, and a second short-circuiting ring 4 manufactured from a same layer as the gate lines. The first short-circuiting ring 3 and the second short-circuiting ring 4 are connected to the wiring terminals 92. Among the above plurality of metal traces 2, as shown in FIG. 2, metal traces 21 connected to the first short-circuiting ring 3 and metal traces 22 connected to the second short-circuiting ring 4 are alternately arranged.

The first short-circuiting ring 3 and the second short-circuiting ring 4 are provided in different layers, and the metal traces 21 connected to the first short-circuiting ring 3 and the metal traces 22 connected to the second short-circuiting ring 4 are alternately arranged, this facilitates inputting different signals into any two adjacent data signal lines 1 so as to facilitate detecting the data signal lines 1.

In the above embodiment, connection between each metal trace 21 and the first short-circuiting ring 3 may be implemented in various ways. Since the first short-circuiting ring 3 and the data signal lines 1 are manufactured from the same layer, the first short-circuiting ring 3 and the metal traces 2 are provided in different layers and may be connected directly through via holes.

Figure 4:
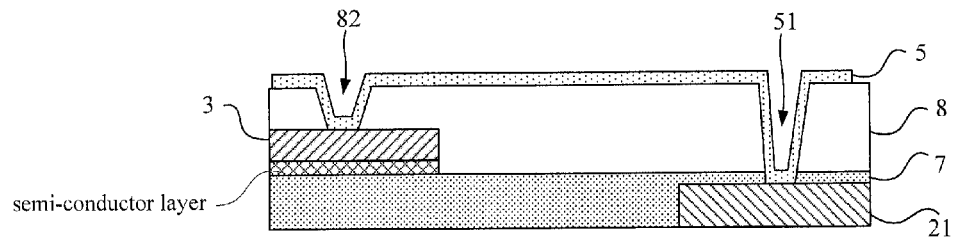
FIG. 4 is a schematic structural diagram showing electrical connection positions between one metal trace and a first short-circuiting ring in an array substrate according to one embodiment of the present disclosure.

Practically, referring to FIG. 2 and FIG. 4, based on the above embodiment, as shown in FIG. 2, each metal trace 21 connected to the first short-circuiting ring 3 is electrically connected to the first short-circuiting ring 3 via a connection line 5.

As shown in FIG. 4, the first insulating layer 7 is provided between the metal trace 21 and the first short-circuiting ring 3. The second insulating layer 8 is provided between the first short-circuiting ring 3 and the connection line 5. The first insulating layer 7 and the second insulating layer 8 have first via holes 51 which are corresponding to the metal traces 21 in a one-to-one manner. The second insulating layer 8 has a second via hole 82 which is corresponding to the first short-circuiting ring 3. Each connection line 5 is electrically connected to the corresponding metal trace 21 via the first via hole 51, and is electrically connected to the first short-circuiting ring 3 via the second via hole 82, thereby achieving the connection between the metal trace 21 and the first short-circuiting ring 3, and finally achieving the connection between the first short-circuiting ring 3 and the data signal line 1 which is corresponding to the metal trace 21.

In a preferred embodiment, the array substrate further includes pixel electrodes formed on the second insulating layer 8. In order to reduce the thickness of the array substrate, the connection line 5 between the above data signal line 1 and the corresponding metal trace 2, and the connection line 6 between the first short-circuiting ring 3 and the corresponding metal trace 21, are manufactured from the same layer as the pixel electrodes.

Optionally, the connection lines 5 and 6 may be connection lines made of ITO material.

Further, a display device is also provided in the present disclosure. The display device includes any one of the array substrates according to the above embodiments. The display device facilitates realization of the narrow bezel design.

Figure 5:
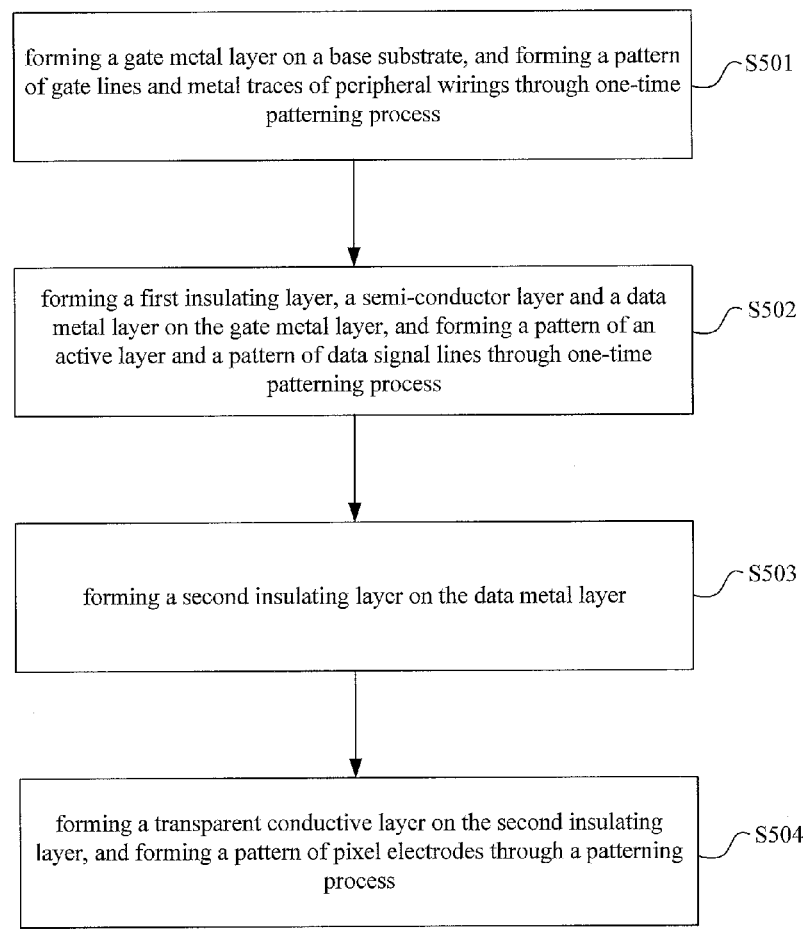
FIG. 5 is a schematic diagram showing a principle of a method for manufacturing an array substrate according to one embodiment of the present disclosure.

Referring to FIG. 5, a method for manufacturing the above array substrates is also provided in the present disclosure, which includes:

Step S501: forming a gate metal layer on a base substrate, and forming a pattern of gate lines and metal traces of peripheral wirings through one-time patterning process;

Step S502: forming a first insulating layer, a semi-conductor layer and a data metal layer on the gate metal layer, and forming a pattern of an active layer and a pattern of data signal lines through one-time patterning process;

Step S503: forming a second insulating layer on the data metal layer;

Step S504: forming a transparent conductive layer on the second insulating layer, and forming a pattern of pixel electrodes through a patterning process.

In the array substrate manufactured through the above method, the gate lines and the metal traces of the peripheral wirings in the data lead area are manufactured in step S501, and the metal traces and the gate lines are manufactured from the same layer, thus a width of each metal trace and an interval between two adjacent metal traces may be relatively small; this may reduce the space occupied by the above peripheral wirings (peripheral traces) when wiring, and facilitate the narrow bezel design of the display device.

In an optional embodiment, in step S501, a pattern of a second short-circuiting ring of the peripheral wirings is also formed at the time of forming a pattern of gate lines and metal traces of peripheral wirings through one-time patterning process. In step S502, a pattern of a first short-circuiting ring of the peripheral wirings is also formed at the time of forming a pattern of an active layer and a pattern of data signal lines through one-time patterning process. Metal traces connected to the first short-circuiting ring and metal traces connected to the second short-circuiting ring are alternately arranged; and the first short-circuiting ring and the second short-circuiting ring are connected to wiring terminals, respectively.

In an optional embodiment, the forming a second insulating layer on the data metal layer of step S503 specifically includes:

forming a plurality of second via holes penetrating through the first insulating layer and forming a plurality of first via holes penetrating through the first insulating layer and the second insulating layer through a patterning process.

In step S504, a pattern of connection lines connecting metal traces to the data signal lines, and a pattern of connection lines connecting metal traces to the first short-circuiting ring are also formed at the time of forming a pattern of pixel electrodes through a patterning process.

The connection line connecting the metal trace to the data signal line may be connected to the metal trace via the first via hole, and may be connected to the data signal line via the second via hole.

The connection line connecting the metal trace to the first short-circuiting ring may be connected to the metal trace via the first via hole, and may be connected to the first short-circuiting ring via the second via hole.

Apparently, various modifications and variations may be made to the embodiments of the present disclosure by those skilled in the art without deviating from the spirit and scope of the present disclosure. Thus, the present disclosure is intended to contain these modifications and variations, which fall within the scope of the claims of the present disclosure and its equivalents.

What is claimed is:

1. An array substrate, comprising a display area and a data lead area, the display area comprising data signal lines and gate lines, and the data lead area comprising peripheral wirings connected between the data signal lines and wiring terminals, wherein the peripheral wirings comprise a plurality of metal traces, and with all the data signal lines corresponding to the metal traces in a one-to-one manner such that each of the metal traces is connected to one of the data signal lines which is corresponding to the each of the metal traces;
   wherein the data signal lines and the metal traces are provided in different layers; each of the metal traces and the corresponding data signal line are connected directly through a via hole; and
   wherein the array substrate further comprises a first short-circuiting ring and a second short-circuiting ring; wherein the first short-circuiting ring and the second short-circuiting ring are connected to the wiring terminals; among the plurality of metal traces, metal traces connected to the first short-circuiting ring and metal traces connected to the second short-circuiting ring are alternately arranged;
   wherein the array substrate further comprises a first insulating layer and a semi-conductor layer;
   wherein the first insulating layer covers the second short-circuiting ring, the metal traces and the gate lines; the semi-conductor layer is on the first insulating layer;
   the first short-circuiting data signal lines are on the semi-conductor layer.

2. The array substrate according to claim 1, wherein the first short-circuiting ring and the metal traces are provided in different layers, and are connected directly through via holes.

3. A display device, comprising an array substrate according to claim 1.

4. A method for manufacturing an array substrate according to claim 1, the method comprising:
   forming a gate metal layer on a base substrate, and forming a pattern of gate lines and metal traces of peripheral wirings through one-time patterning process;
   forming a first insulating layer, a semi-conductor layer and a data metal layer on the gate metal layer, and forming a pattern of an active layer and a pattern of data signal lines through one-time patterning process;
   forming a second insulating layer on the data metal layer; and
   forming a transparent conductive layer on the second insulating layer, and forming a pattern of pixel electrodes through a patterning process.

5. The method according to claim 4, further comprising: forming a pattern of a second short-circuiting ring of the peripheral wirings at the time of forming a pattern of gate lines and metal traces of peripheral wirings through one-time patterning process; forming a pattern of a first short-circuiting ring of the peripheral wirings at the time of forming a pattern of an active layer and a pattern of data signal lines through one-time patterning process; wherein among the metal traces, metal traces connected to the first short-circuiting ring and metal traces connected to the second short-circuiting ring are alternately arranged; and the first short-circuiting ring and the second short-circuiting ring are connected to wiring terminals, respectively.

6. The array substrate according to claim 1, wherein the first short-circuiting ring and the data signal lines are directly on the semi-conductor layer.

7. The array substrate according to claim 1, further comprising a second insulating layer;
   wherein the second insulating layer covers the first short-circuiting ring, the data signal lines and the first insulating layer.

* * * * *